United States Patent
Lin et al.

(10) Patent No.: US 6,291,112 B1
(45) Date of Patent: Sep. 18, 2001

(54) METHOD OF AUTOMATICALLY FORMING A RIM PHASE SHIFTING MASK

(75) Inventors: Chin-Lung Lin, Kaohsiung; Yao-Ching Ku, Hsinchu Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/191,762

(22) Filed: Nov. 13, 1998

(51) Int. Cl.$^7$ ...................................................... G03F 9/00
(52) U.S. Cl. ................................................................ 430/5
(58) Field of Search ............................ 430/5, 322, 323, 430/324, 311

(56) References Cited

U.S. PATENT DOCUMENTS 5,306,585 * 4/1994 Okamoto .................................. 430/5
5,827,623 * 10/1998 Ishida et al. .............................. 430/5

* cited by examiner

Primary Examiner—S. Rosasco
(74) Attorney, Agent, or Firm—Charles C. H. Wu; Charles C. H. Wu & Associates

(57) ABSTRACT

A method of automatically forming a rim PSM is provided. A first pattern comprising a conventional original pattern as a blinding layer and assist features around the conventional circuit pattern is designed. A portion of a Cr film and a portion of a phase shifting layer under the Cr film are removed with the first pattern. The removed portion of the Cr film and the removed portion of the phase shifting layer are positioned on the assist feature. A second pattern comprising the conventional circuit pattern and a half of the assist features is designed. A portion of the Cr film in positions other than on the second pattern is removed. The convention circuit pattern formed at the mask medium is defined as the blinding layer. The area of the assist features only comprise a quartz substrate that light can pass through. The other areas of the mask medium wherein the phase shifting layer remains is defined as the phase-shifting portion of the PSM.

14 Claims, 3 Drawing Sheets

METHOD OF AUTOMATICALLY FORMING A RIM PHASE SHIFTING MASK

BACKGROUND OF THE INVENTION

1. Field of the Invention

The invention relates in general to semiconductor fabrication technologies, and more particularly to a phase-shifting mask (PSM) for use in photolithography in semiconductor fabrication processes. PSM can eliminate ghost lines that would otherwise occur due to side-lobe effect in the resulted pattern definition.

2. Description of the Related Art

In semiconductor fabrication, photolithography is an important and indispensable technique which is used to transfer circuit layout patterns by means of a mask onto predefined locations on a semiconductor wafer. Many processes in semiconductor fabrications, such as etching and ion plantation, require the use of photolithography. In a photolithography process, resolution and depth of focus (DOF) are two major checkpoints used to appraise the quality of the pattern definition. A high level of integration requires a high resolution of pattern definition since the feature size is very small To increase the resolution, a laser source with a very short wavelength, such as a krypton (Kr) deep ultra-violet laser with a wavelength of 2,480 Å (angstrom), is used as the exposure light in the photolithography process. The use of a short-wavelength exposure light, however, will result in a shallow DOF. To allow high resolution and good DOF, one solution is to use the so-called phase-shifting mask (PSM).

Fundamentally, a PSM is formed by adding phase shifter layers onto a conventional mask in order to cause destructive interference to the light passing through the PSM such that the contrast and resolution of the resulting pattern definition can be increased. One benefit of the PSM is that it can increase the resolution of pattern definition without having to change the wavelength of the exposure light.

FIGS. 1A–1C are schematic, cross-sectional diagrams used to depict three different conventional PSM structures. FIG. 1A shows a typical PSM, which includes a quartz substrate 10, a plurality of chromium (Cr) layers 12 coated over the quartz substrate 10 to serve as the blinding portions of the PSM and a shifter layer 14 that can cause a phase shift to the light passing through it so as to enhance the resolution of the resulting pattern definition from the PSM. FIG. 1B shows a conventional rim PSM, which includes a quartz substrate 10 and a plurality of Cr layers 12 coated over the quartz substrate 10. Each Cr layer 12 is covered by a shifter layer 16 that can cause a phase shift to the light passing through it so as to enhance the resolution of the resulting pattern definition from the PSM. FIG. 1C shows a variation of the rim PSM, which differs from the rim PSM of FIG. 1B only in that here the shifter layers 16 are layered beneath the Cr layers 12.

In the foregoing PSM structures respectively shown in FIGS. 1A–1C, the shifting layer is formed from $MoSi_zO_xN_y$ or $SiO_xN_y$. One drawback to these conventional PSM structures is that they all require two etching steps, one for defining the Cr layers and the other for defining the shifter layers. The overall fabrication process is therefore quite complex in procedural steps, which makes the manufacturing cost considerably high. Furthermore, the pattern of a shifting layer and the pattern of a Cr layer are designed by hand. Fabrication time is therefore long and mistakes are easily made in the process.

SUMMARY OF THE INVENTION

It is therefore an object of the invention to provide a method of automatically forming a rim phase shifting mask for use in photolithography in semiconductor fabrication, which can form patterns of Cr layers and of phase shifting layers automatically using an original file from a circuit design. The method of forming a rim PSM reduces fabricating time and prevents mistakes from being incorporated into the design.

In accordance with the foregoing and other objectives of the present invention, a method of automatically forming a rim PSM is provided. A mask medium comprising a quartz substrate, a phase shifting layer and a Cr film is provided. A first pattern comprising a conventional, original pattern as a blinding layer and assist features around the conventional circuit pattern is designed. A portion of a Cr film and a portion of a phase shifting layer under the Cr film are removed with the first pattern. The removed portion of the Cr film and the removed portion of the phase shifting layer are in the assist feature positions. A second pattern comprising the conventional circuit pattern and a half of the assist feature is designed. A portion of the Cr film in the position other than that of the second pattern is removed. The conventional circuit pattern formed by the mask medium is defined as the blinding layer. The area of the assist features only comprises a quartz substrate that light can pass through. The other area of the mask medium wherein the phase shifting layer remains is defined as the phase-shifting portion of the PSM.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
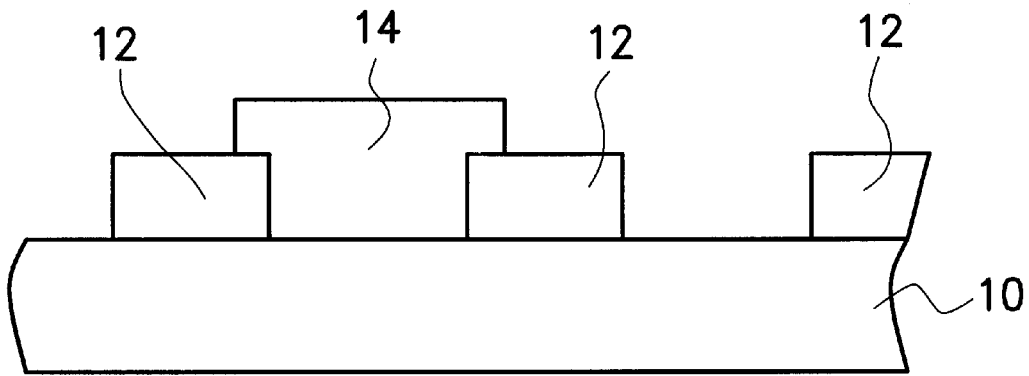
FIGS. 1A–1C are schematic, cross-sectional diagrams used to depict three different conventional PSM structures.
Figure 1B:
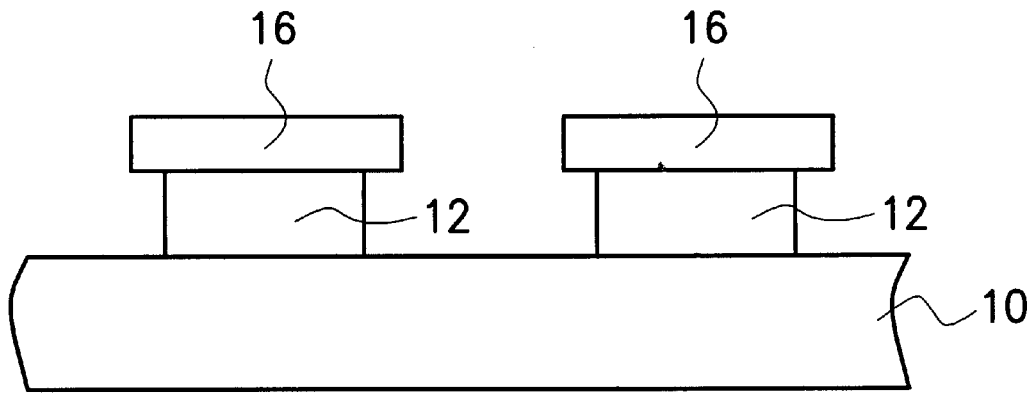
Figure 1C:
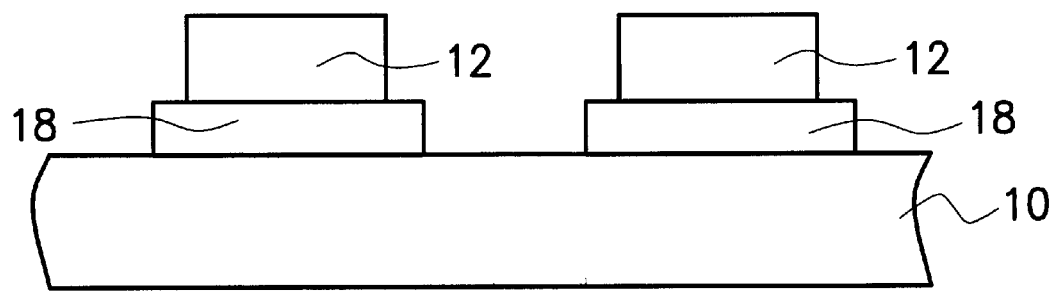
Figure 2A:
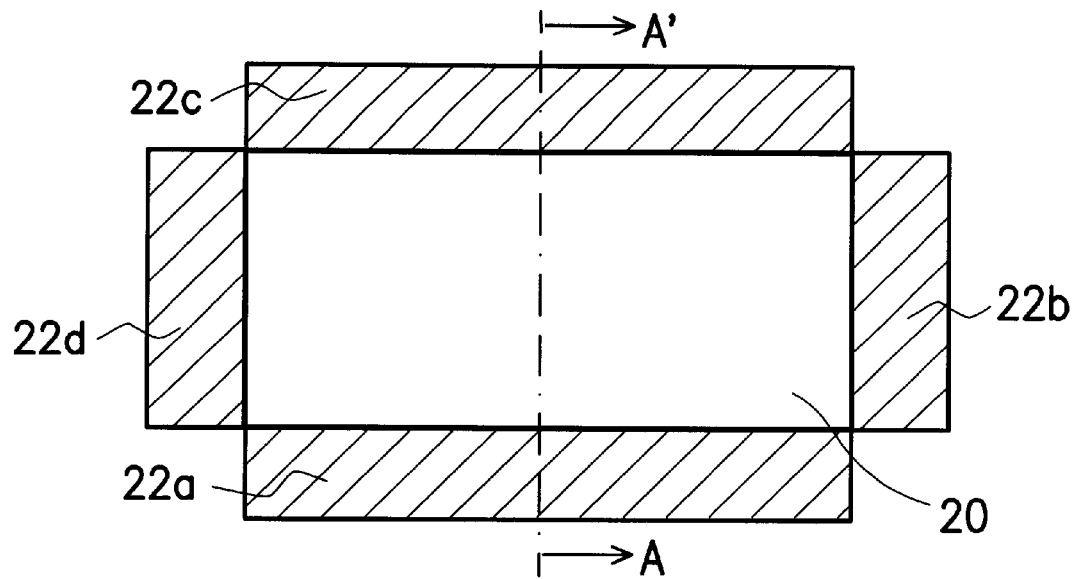
FIG. 2A is a schematic, top view showing the first pattern of the rim PSM according to the invention.

As shown in FIG. 2A, original pattern 20 is defined as a blinding layer in a conventional method. The invention provides assist features 22a, 22b, 22c and 22d around the original pattern 20 to define a blinding pattern of a rim PSM. The original pattern 20 comprises conventional circuit patterns. The assist features 22a, 22b, 22c and 22d adjoin the original pattern 20 and have a width "W" of about 0.05–0.5 um.

Figure 2B:
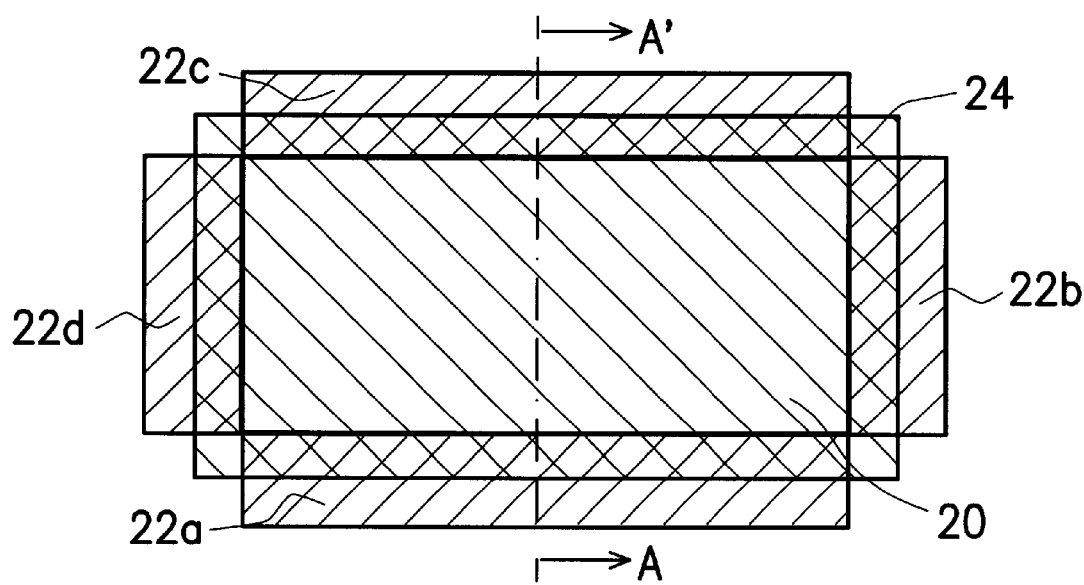
FIG. 2B is a schematic, top view showing the second pattern of the rim PSM according to the invention.

Referring to FIG. 2B, shifting pattern 24 defines a shifting layer. The area of the shifting pattern 24 comprises the original pattern 20 as the blinding layer and a half of the assist features 22a, 22b, 22c and 22d. A distance between the shifting pattern 24 and the original pattern 20 is about a half of the width of the assist feature 22a, 22b, 22c and 22d.

Figure 3A:
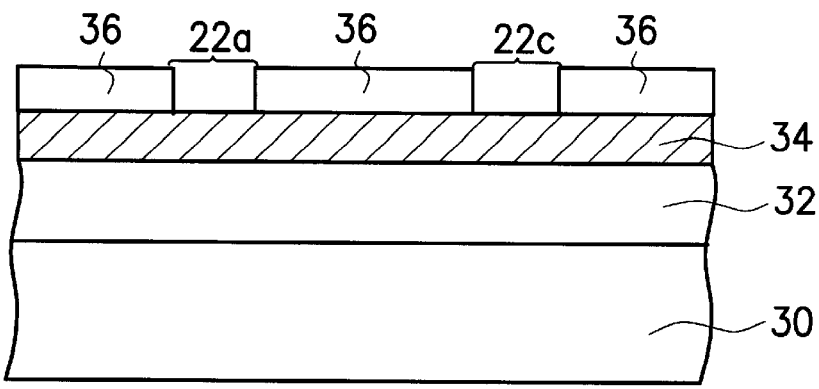
FIGS. 3A–3D are schematic, cross-sectional views showing the process of one preferred embodiment of the method of forming the rim PSM.
Figure 3B:
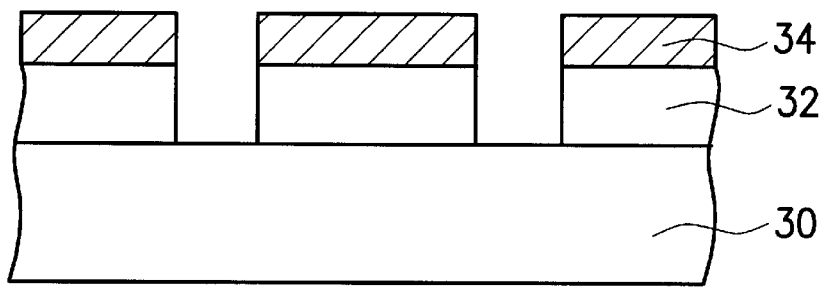

FIGS. 3A–3B are cross-sectional views along the line AA' in FIG. 2A and in FIG. 2B showing the process of forming the rim PSM. As shown in FIG. 3A, a substrate 30 such as quartz is provided. A shifting layer 32 is formed on the substrate 30. The shifting layer 32 is capable of causing a phase shift of 180° to the light passing through the shifting layer 32. In addition, the phase shifting effect of the shifting layer can be provided by etching the quartz substrate 30. Light passing through a position at which the substrate 30 is not etched causes a phase shift of 0°. Light passing through another position at which a part of the substrate 30 is etched causes the phase shift of 180°. A blinding layer 34, such as a Cr film, is formed on the shifting layer 32. A defined first photoresist layer 36 is provided on the blinding layer 34. The pattern of the defined first photoresist layer 36 is shown in FIG. 2A. Openings of the first photoresist layer 36 are at the positions of the assist feature 22a and 22c. These openings have a width of W.

As shown in FIG. 3B, portions of the blinding layer 34 and the shifting layer 32 are removed according to the pattern of the first photoresist layer 36 to expose the substrate 30 in the position of the assist features 22a, 22b, 22c and 22d (wherein the assist features 22b and 22d are not shown).

In FIG. 3B, the blinding layer 34 and the shifting layer 32 under the first photoresist layer 36 in the position of the assist features 22a, 22b, 22c and 22d are removed to expose the quartz substrate 30. The first photoresist layer 36 is removed after exposing the quartz substrate 30.

Figure 3C:
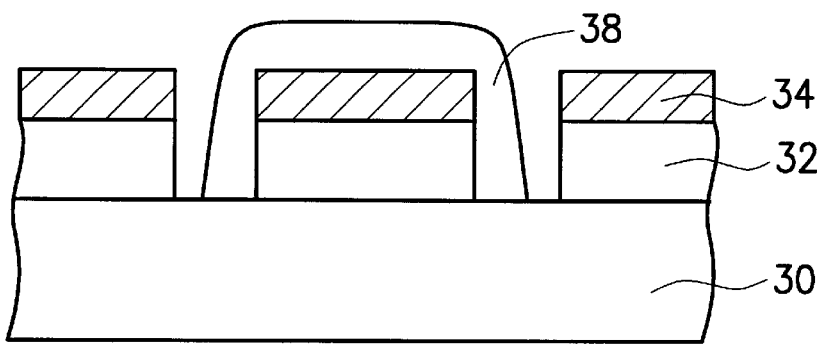

As shown in FIG. 3C, a defined second photoresist layer 38 is provided on the structure shown in FIG. 3B. A shifting layer pattern of the defined second photoresist layer 36 is shown in FIG. 2B.

Figure 3D:
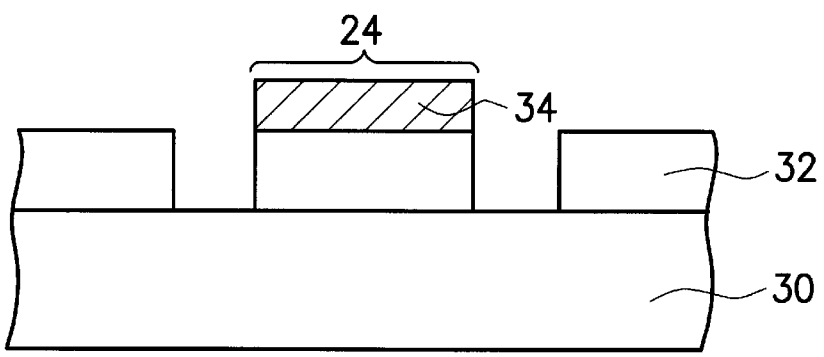

In FIG. 3D, the blinding layer 34 no covered by the second photoresist layer 38 is removed to expose the shifting layer 32. The shifting layer 32 is capable of causing a phase shift of 180° to light passing through it. The second photoresist layer 38 is removed to complete the rim PSM.

In the invention, a pattern for a blinding layer is formed by combining an original pattern and assist features. A pattern for the shifting layer is formed according the pattern of the blinding layer. The blinding layer and the shifting layer are formed automatically using a modified original file from a circuit design. The method of forming a rim PSM reduces fabricating time and prevents mistakes from being incorporated into the design.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of automatically forming a rim phase shifting mask using an original pattern, comprising the steps of:
   providing a substrate having a blinding layer and a shifting layer thereon;
   providing the original pattern with assist features around the original pattern;
   defining a blinding layer pattern with a first photoresist layer which is defined to form the original pattern and the assist features thereon to remove the blinding layer and the shifting layer in a position on the assist feature of the first photoresist layer; and
   defining a shifting layer pattern with a second photoresist layer to remove the blinding layer in the position other than on the shifting layer pattern.

2. The method according to claim 1, wherein the blinding layer comprises a chromium layer.

3. The method according to claim 1, wherein the assist features adjoin the original pattern.

4. The method according to claim 1, wherein a width of each of the assist features is about 0.05–05 um.

5. The method according to claim 1, wherein an area of the shifting layer pattern comprises the original pattern and a half of the assist features.

6. The method according to claim 1, wherein the substrate comprises quartz.

7. A method of automatically forming a rim phase shifting mask using a original pattern, comprising the steps of:
   providing a substrate having a blinding layer and a shifting layer thereon;
   designing a blinding pattern comprising the original pattern and assist features around the original pattern;
   defining a first photoresist layer to form the blinding layer pattern thereon;
   removing the blinding layer and the shifting layer in the position on the blinding layer pattern of the first photoresist layer;
   designing a shifting layer pattern comprising the original pattern and a half of the assist features;
   defining a second photoresist layer to form the shifting layer pattern thereon;
   removing the blinding layer in the position other than on the shifting layer pattern.

8. The method according to claim 7, wherein the blinding layer comprises a chromium layer.

9. The method according to claim 7, wherein a width of each of the assist features is about 0.05~0.5 μm.

10. The method according to claim 7, wherein the substrate comprises quartz.

11. A method of automatically forming a rim phase shifting mask using an original pattern, comprising the steps of:
   providing a substrate having a blinding layer thereon;
   designing a blinding pattern comprising the original pattern and assist features around the original pattern;
   defining a first photoresist layer to form the blinding layer pattern thereon;
   removing the blinding layer and a part of the substrate in the position on the blinding layer pattern of the first photoresist layer wherein the removed substrate causes a phase shift of 180° to light passing through it;
   designing a shifting layer pattern comprising the original pattern and a half of the assist features;
   defining a second photoresist layer to form the shifting layer pattern thereon;
   removing the blinding layer in the position other than on the shifting layer pattern.

12. The method according to claim 11, wherein the blinding layer comprises a chromium layer.

13. The method according to claim 11, wherein a width of each of the assist features is about 0.05–0.5 um.

14. The method according to claim 11, wherein the substrate comprises quartz.

* * * * *